United States Patent [19]

Green et al.

[11] Patent Number: 4,520,281
[45] Date of Patent: May 28, 1985

[54] WIDE PULSE RANGE PERIODIC REVERSE UNIT

[75] Inventors: Ralph R. Green; Robert C. Green, both of Hiram, Ohio

[73] Assignee: Imperial Clevite Inc., Glenview, Ill.

[21] Appl. No.: 349,433

[22] Filed: Feb. 16, 1982

Related U.S. Application Data

[63] Continuation of Ser. No. 067,971, Aug. 20, 1979, abandoned.

[51] Int. Cl.$^3$ ................. H03K 15/082; H03K 15/14
[52] U.S. Cl. .................................. 307/475; 307/260; 307/311; 307/252 R
[58] Field of Search ............ 307/475, 311, 260, 252 N, 307/252 UA, 252 R

[56] References Cited

U.S. PATENT DOCUMENTS

| | | | |
|---|---|---|---|
| 3,693,947 | 6/1976 | Bogel | 307/311 |
| 4,041,331 | 8/1977 | Westerman et al. | 307/311 |
| 4,197,471 | 4/1980 | Lackey et al. | 307/475 |

Primary Examiner—Stanley D. Miller
Assistant Examiner—B. P. Davis
Attorney, Agent, or Firm—Russell E. Baumann

[57] ABSTRACT

An electrical control circuit particularly adapted for providing high current pulses in a wide frequency pulse range. The circuit is comprised of a timing and control circuit, a high power switching circuit, and an interfacing isolating circuit. The timing and control circuit includes a plurality of variable frequency pulse generators whose outputs are distinguished and combined to form a single wave signal. The power switching circuit includes a plurality of high speed switches for applying high current pulses to a load in associated response to the wave signal. The isolating circuit includes a plurality of isolating switches for insulating the timing and control circuit from interference from the power switching circuit while permitting the timing and control circuit output to control the application of higher energy and frequency pulses by the power switching circuit to a load than was heretofore available.

11 Claims, 3 Drawing Figures

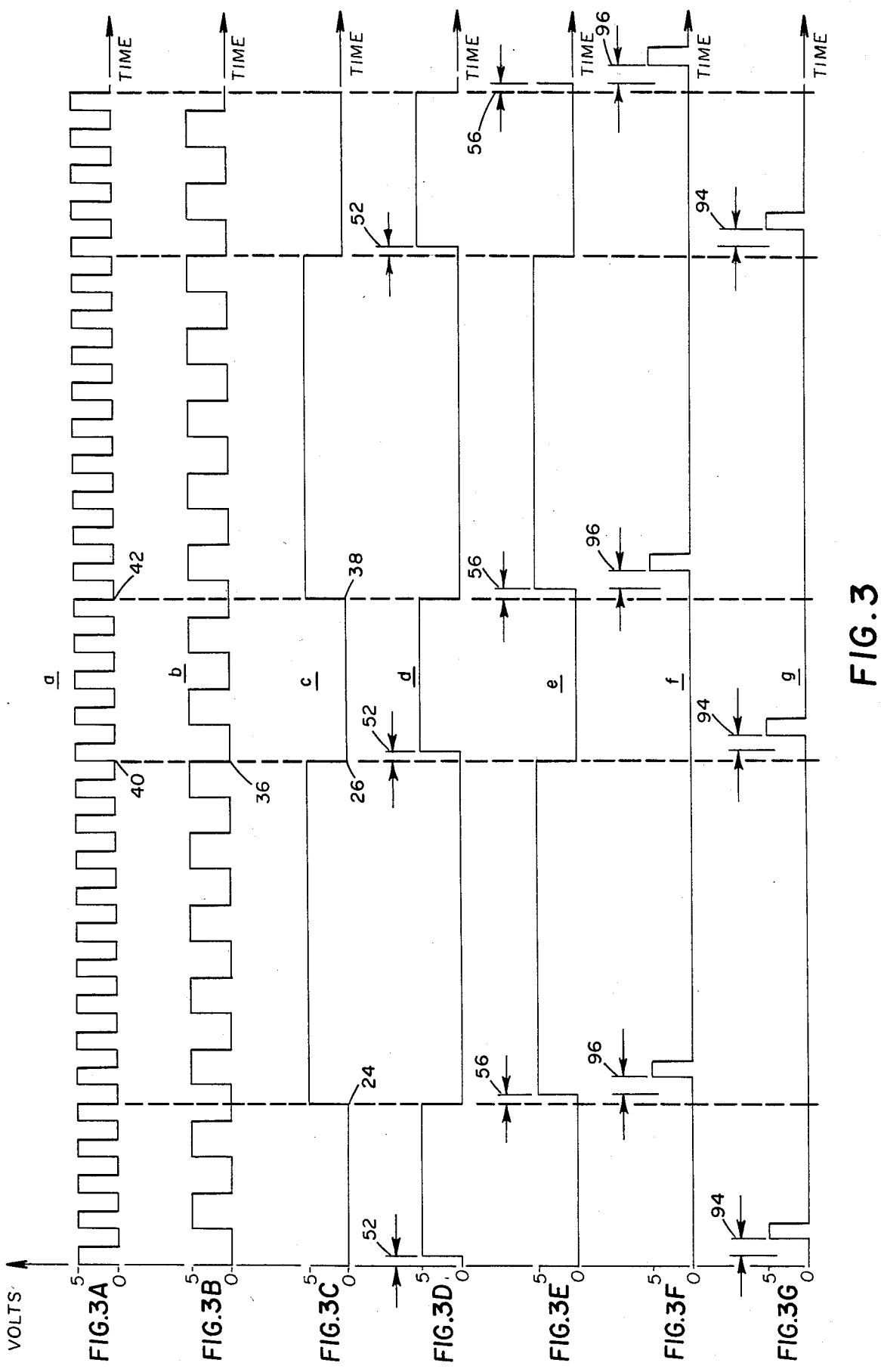

WIDE PULSE RANGE PERIODIC REVERSE UNIT

This application is a continuation of application Ser. No. 067,971 filed Aug. 20, 1979 now abandoned.

BACKGROUND OF THE INVENTION

This invention pertains to the art of electrical control circuits and more particularly to novel control circuitry for obtaining wide pulse range periodic reversal of current.

The invention is particularly applicable for use as a pulser of direct current or as a periodic reverse unit in the electrolytic plating industry. However, it will be appreciated by those skilled in the art that the invention could be readily adapted to use in other environments as, for example, where similar circuitry is employed to generate a wide pulse range with high current.

The electrolytic plating of a cathode is effected by the deposit of ions electrically drawn from an ambient bath and, in particular, from a zone of the bath adjacent the cathode which is typically referred to as the cathode diffusion layer. During plating, the cathode diffusion layer is depleted of ions. After plating, ions rediffuse into the depleted diffusion layer to the ion concentration level of the ambient bath. When the rate of deposition of ions exceeds the rate of diffusion of ions into the cathode diffusion layer, the current density of the system exceeds the deposition limiting current densities and, a generally undesirable deposit reults. It is common practice to exceed the limiting current density with a plating current. To avoid the effects of exceeding the limiting current density, the plating industry has generally adopted pulse-plating arrangements wherein the time between pulses of plating current the cathodic film is given ample time to rebuild itself. In this regard, greater overall efficiency in the deposit rate results when shorter pulses of very high current are used.

Periodic reversal of current in electrolytic plating has been used in the industry to produce a smoother, better plated surface. During reverse current flow, undesired particles which may have attached themselves to the plating surface may be thrown off, and gross irregularities in the electrodeposits, such as trees or nodules, which have risen above the level of the cathode surface are dissolved and leveled at least in part. It is an inherent characteristic of electroplating that trees rising above the cathode surface grow in electrodeposit rate faster than the surrounding smooth surface. Similarly, during reversal of current, the trees dissolve faster. See generally Lowenheim, Modern Electroplating, 3rd Ed. John Wiley & Sons, Inc. (1974, pgs. 1–43).

Periodic reverse current has been achieved in the past by either mechanical switch means employing relays and mechanical switches or by solid state switching means employing silicon controlled rectifiers or transistors. The mechanical switching means have the primary disadvantages and limitation of slow switching rates. The solid state switching means have the primary disadvantage and limitation of low currents.

The present invention overcomes the above-noted limitations in the prior art and thus provides an improvement in the generation of wide pulse ranges and high currents and in extending their useful applications.

BRIEF SUMMARY OF THE INVENTION

In accordance with one aspect of the present invention, there is provided a timing and control circuit and an associated power switching circuit particularly suited for generating current pulses over a wide frequency range and at high amperage. The timing and control circuit is generally comprised of a plurality of pulse generators whose outputs are generally distinguished and combined in logic circuitry means to generate a signal pulse to control the power switching circuit. The power switching circuit is generally comprised of a plurality of high power switches and means for applying high current pulses to the desired load.

In accordance with another aspect of the present invention, the high power switches comprise solid state devices such as silicon controlled rectifiers and high current transistors.

In accordance with another aspect with the present invention, the timing and control pulse is delayed on both its moving high alternation and moving low alternation in order to avoid short circuiting of the power switching circuit as a result of solid state circuitry response times.

In accordance with yet another aspect of the present invention, the timing and control circuit includes circuitry for converting the signal pulse into a silicon controlled rectifier trigger pulse.

In accordance with a further aspect of the present invention, the timing and control circuit is interfaced with the power switching circuit by means of insulating opti-couplers.

In accordance with still another aspect of the present invention the timing and control circuit includes at least one means for interrupting the signal pulse for purposes of creating either alternating current or pulses of direct current.

A primary benefit obtained from the present invention is the provision of a new and improved electric control circuit which has a wide pulse range capability.

Another benefit obtained from the present invention is the provision of a new and improved power switching circuit having a higher current capability and a faster switching time.

A still further benefit obtained from the present invention is the provision of a new and improved periodic reverse unit having the above characteristics which can provide for more efficient electrolytic plating.

Other benefits and advantages for the subject invention will become apparent to those skilled in the art upon a reading and understanding of this specification.

BRIEF DESCRIPTION OF THE DRAWINGS

The invention may take physical form in certain parts and arrangement of parts, a preferred embodiment of which will be described in detail in this specification and illustrated in the accompanying drawings which form a part hereof and wherein.

DETAILED DESCRIPTION OF THE INVENTION

Figure 1:
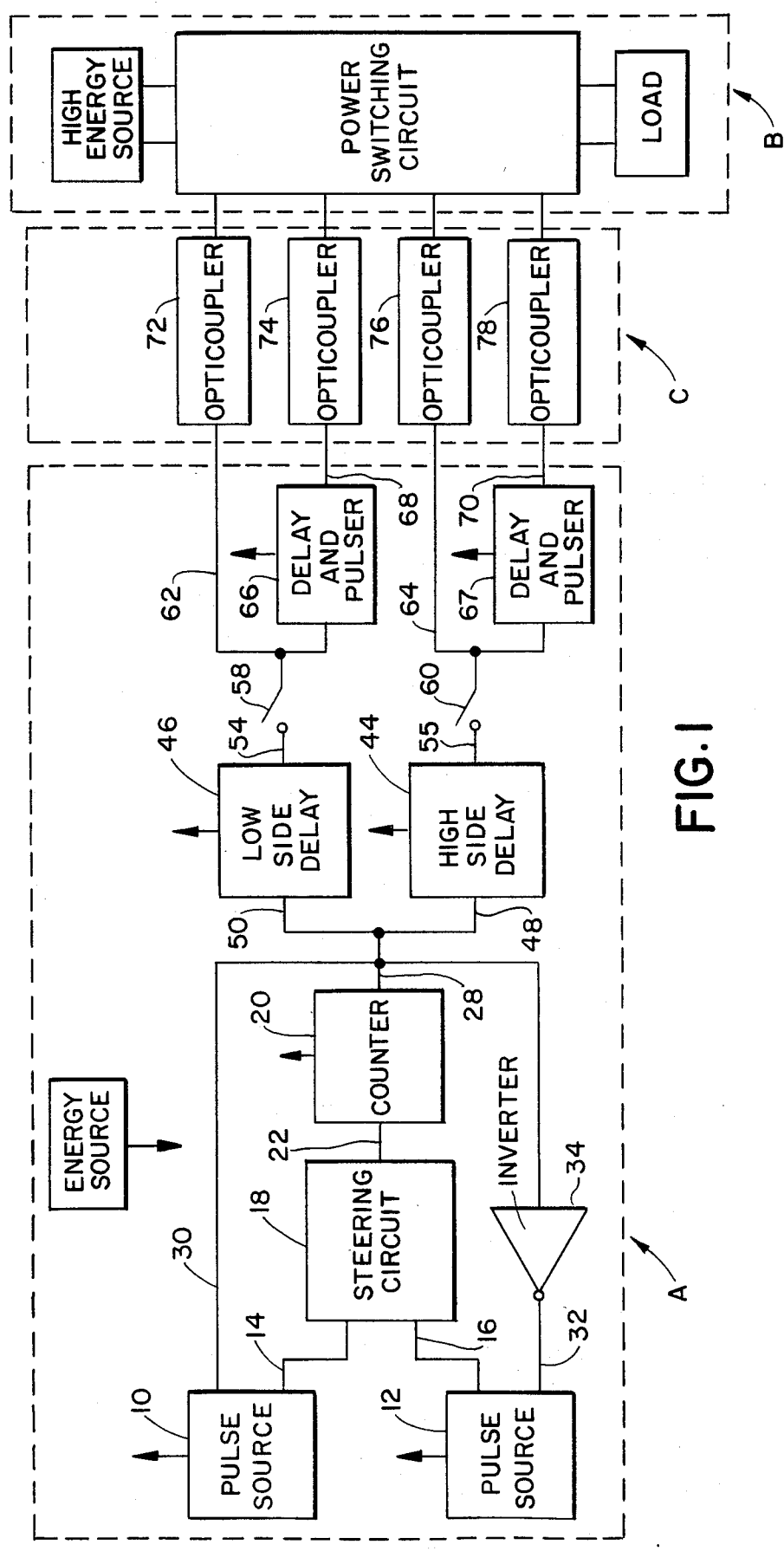
FIG. 1 is a schematic block diagram of an electrical circuit formed in accordance with the present invention.

Referring now to the drawings wherein the showings are for purposes of illustrating a preferred embodiment of the invention only and not for purposes of limiting same, FIG. 1 shows a block diagram of an electrical circuit comprised of a timing and control circuit A, a power switching circuit B, and an isolating circuit C for interfacing the timing and control circuit with the power switching circuit.

More specifically and with continued reference to FIG. 1, timing and control circuit A has a first pulse source 10 and a second pulse source 12. Typically, a pulse source is comprised of a square wave generator with a variable voltage and frequency output. Where great precision is desired, a digitally controlled square wave generator may be preferred although a simple rheostat controlled pulse source would be satisfactory. A typically frequency range for the pulse source is 1,000–0.001 hertz and, in the preferred embodiment disclosed, a step wave pulse ranging from 0–5 volts is advantageously employed. The output of pulse source 10 is illustrated as on circuit path 14 and the output of pulse source 12 is illustrated as on circuit path 16. FIGS. 3A and 3B show illustrative pulse source outputs a, b for pulse sources 10, 12 respectively. Typically, the outputs are of different frequencies since the period of each will be proportionate to the duration of respective forward or reverse current flow to the load. In typical electroplating applications utilizing a periodic reverse unit, the durations of forward and reverse current differ from each other.

The outputs of the pulse sources 10, 12 are circuited through paths 14, 16 to a steering circuit 18 which comprises a logic circuit whose output on circuit path 22 drives a counter 20. Steering circuit 18 typically comprises a quad-nand type logic circuit. In the preferred embodiment hereunder discussion, counter 20 comprises an asynchronous decade counter or a "divide-by-ten" and acts to reduce the frequency of its input by a factor of ten. However, a simple flip-flop arrangement would also be satisfactory. Based on the exemplary pulses of source inputs a, b shown in FIGS. 3A and 3B, a divide-by-ten would give an output c as shown in FIG. 3C. A divide-by-ten changes its output state after detecting ten changes of state of its input signal. For example and with reference to FIG. 3C, it can be seen that between points 24, 26, ten changes of state between 0 and 5 volts occurred on FIG. 3B.

The output of counter 20 on circuit path 28 determines whether output of sources 10 or 12 is being fed to steering circuit 18. Inhibits in pulse sources 10, 12 are connected to circuit paths 30, 32, respectively. When the output of counter 20 on circuit path 28 is high, the inhibit in pulse source 10 will be operable so that there will be no output therefrom. At the same time, pulse source 12 will have an output since the input to the inhibit of pulse source 12 has been inverted from high to low by means of an inverter 34.

Where counter 20 comprises a divide-by-ten type, it will count ten input changes of state before it changes its output on circuit path 28. When its output is low, the inhibit at pulse source 10 is not operable and therefore, pulse source 10 has an output. At the same time, a low output of the counter is inverted to a high output by inverter 34. This turns the inhibit of pulse source 12 on which, in turn, restrains the output of pulse source 12. Therefore, it can be seen that pulse sources 10 and 12, steering circuit 18 and counter 20 cooperate so as to permit only one pulse source to feed counter 20 at one time.

FIGS. 3A, 3B and 3C illustrate how the alternate high and low sides of the counter output signal are a function of pulse sources 10, 12. FIGS. 3A and 3B show respective exemplary outputs a, b of pulse sources 10, 12, respectively, and FIG. 3C shows a corresponding output c from counter 20. When the output c of counter 20 goes high, pulse source 10 is inhibited and the output b of pulse source 12 is steered into counter 20. Where the counter is a divide-by-ten type, it will count ten changes of state before it changes the state of its output. With reference to FIGS. 3B and 3C, it will be seen where counter output c is high, ten changes of state for the output b of pulse source 12 occur in the same period. Upon the tenth change of state, as at point 36, the output c of the counter goes low, as at point 26. When the counter output c is low, pulse source 12 is inhibited and the output a of pulse source 10 is steered into the counter 20 where ten changes of input state will again be counted before changing the state of output c. As will be seen with reference to FIGS. 3A and 3C, between points 26, 38, ten changes of state of output a occur between points 40, 42 respectively. The duration of the high side output c of counter 20 is, therefore, controlled by the output b from the pulse source 12 while the duration of the low side of the output c of counter 20 is controlled by the output a from pulse source 10.

Referring again to FIG. 1 and FIG. 3, the output of counter 20 is then fed into high side delay 44 and low side delay 46 through circuit paths 48, 50, respectively. The high side delay 44 operates to delay the moving high change of state of the output c of the counter 20; similarly, the low side delay 46 operates to delay the moving low change of state of the output c of counter 20. With reference to FIG. 3D, delay 52 is shown in the graph illustrating the output d on circuit path 54 of low side delay 46. The low side delay 46 also operates to invert the signal. Similarly, FIG. 3E illustrates in the output e on circuit path 55 of high side delay 44, the delay 56 produced in the moving high change of state of the counter 20 output signal. The purpose of the delays is a practical one, i.e., to accommodate high current transistor rise times. Without the necessary delays in the timing and control circuit output signal, dangerous short circuits may occur in the power switching circuit.

Continuing along the circuit of FIG. 1, switches 58, 60 are available to cut off either the high side delayed or low side delayed signal. When both switches 58, 60 are closed the timing and control circuit will operate as a control circuit for a periodic reverse unit. When either switch, 58, 60 is open, the timing and control circuit operates to generate periodic pulses of direct current in a single direction only. Switches 58, 60 preferably include light emitting diodes or some other indicator of whether they are open or closed.

The respective outputs d, e from the delays 46, 44 are each fed directly into the isolating circuit C via circuit paths 62, 64, respectively. Delay and pulser units 66, 67, whose outputs are also fed directly into the isolating circuit C via circuit paths 68, 70 are in parallel with circuit paths 62, 64.

FIG. 3F is a graphical representation of delay and pulser unit 66 output f when the input is as represented in FIG. 3D. FIG. 3G is a graphical representation of the output g of delay and pulser 67 when the input is as graphically represented in FIG. 3E. The outputs f, g of the delay and pulser units 67, are commonly referred to as trigger pulses and are used to switch on silicon controlled rectifiers in the power switching circuit B.

Continuing with reference to FIG. 1, isolating circuit C contains four identical optocoupler units 72, 74, 76, 78. Optocouplers have been utilized in the preferred embodiment due to the high switching speed capability thereof, but other appropriate relay devices could also be advantageously employed. The purpose of the isolation circuit C is to interface timing and control circuit A with power switching circuit B and insulate one from the other for purposes of safety and the avoidance of interference.

Figure 2:
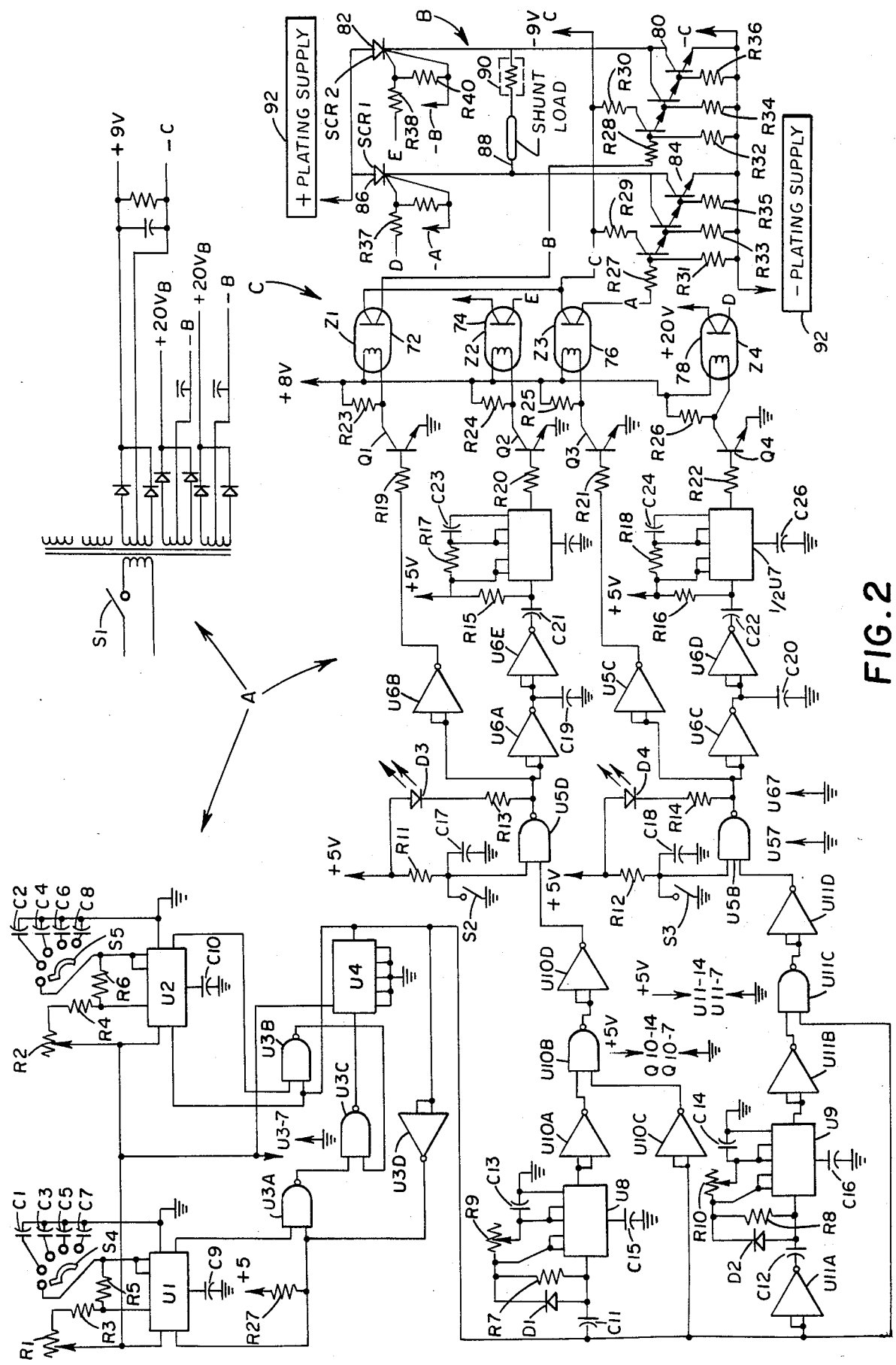
FIG 2 is a detailed schematic circuit diagram of the circuit generally disclosed in FIG. 1; and, FIG. 3 is an exemplary set of graphs A–G of current and voltage wave forms appearing in various points in the circuit formed in accordance with the present invention.

With reference to FIG. 2, a more detailed schematic diagram of the preferred embodiment of the invention described above with reference to FIG. 1 is shown. It will be there seen that the outputs of optocouplers 72, 74, 76, 78 are fed into various switching means 80, 82, 84, 86, respectively. These switching means are the solid state high power switches which are controlled by timing and control circuit A to apply the desired energy to the load. Solid state switching means 86, 82, which comprise silicon controlled rectifiers are preferred due to their high switching speed capability although other appropriate relay means may also be used. Switching means 84, 80 preferably comprise high current transistors due to their high switching speed capability. Here too, however, other appropriate switching means could be used without in any way departing from the overall intent of scope of the invention.

Solid state switching means 86 is paired with solid state switching means 80 such that when switch 86 is operable, switch 80 is also operable to have current running through circuit path 88 to a load 90 from a plating supply power source 92. Switch 82 is paired with switch 84 such that when switch 82 is operable, switch 84 is also operable to have current running through load 90 in a reverse direction to that permittted by the other switches 86, 80. Switch pairs 86, 80 and 82, 84 may at no time be simultaneously operable. In such instance, a short circuit would exist across plating supplying power source 92.

FIG. 3D has been identified as the output d of low side delay 46. FIG. 3D is also a graphical representation of the input to optocoupler unit 72. The output of optocoupler unit 72 will be identical with respect to time as its input. Therefore, FIG. 3D will also be referenced for timing purposes as a graphical representation of the output d of optocoupler unit 72. Similarly, FIGS. 3E, 3F, 36 are graphical representations of the outputs e, f, g, of optocoupler units 76, 74, 78, respectively, for timing purposes.

With reference to FIGS. 2 and 3, the output d of optocoupler unit 72 operates switch 80 where switch 80 comprises a high current transistor. The output g of optocoupler unit 78 operates switch 86 where switch 86 comprises a silicon controlled rectifier. FIG. 3G illustrates an SCR trigger pulse which has a slight delay 94 from the pulses represented in FIG. 3D. The purpose of such delays 94 includes having the silicon controlled rectifier switch the high transient inrush current rather than the transistor to avoid both high voltage and current across the transistor and the consequently high dissipation state.

The output e of optocoupler unit 76 operates switch 84 where switch 84 comprises a high current transistor and the output f of optocoupler 74 operates switch 82 where switch 82 comprises a silicon controlled rectifier. The trigger pulses illustrated in output f have similar delays 96 to the delays 94 of output g, for purposes of having the silicon controlled rectifier switch the high transient inrush current.

As can be seen from the graphical representations illustrated in FIG. 3, neither pair of power switches will be operable at the same time. When both pairs are operable intermittently, the invention can be utilized as a periodic reverse unit for electroplating purposes. When only one pair of switches is operable intermittently, the invention can be used as a direct current pulse for electroplating purposes.

When the herein disclosed embodiment of the invention is utilized in an electroplating application, the load 90 comprises an anode and cathode in an ambient bath including ions of a material desired to be electrolytically deposited on the cathode. Deposit will occur when current flows positively from anode to cathode. The present invention permits current pulses of higher frequency and current to be utilized in electroplating than was heretofore available in the industry. Such pulses result in higher efficiency operations.

In one operating embodiment, the following exemplary components and circuit values were employed in the timing and control circuit of FIG. 2. These components and values are in no way deemed to be to the overall inventive concepts involved.

| | |
|---|---|
| $R_1$ | 100K (VAR) ohms |
| $R_2$ | 100K (VAR) ohms |
| $R_3$ | 1200 ohms |
| $R_4$ | 1200 ohms |
| $R_5$ | 1200 ohms |
| $R_6$ | 1200 ohms |
| $R_7$ | 27K ohms |
| $R_8$ | 27K ohms |
| $R_9$ | 50K (VAR) ohms |
| $R_{10}$ | 50K (VAR) ohms |
| $R_{11}$ | 2200 ohms |
| $R_{12}$ | 2200 ohms |
| $R_{13}$ | 3300 ohms |
| $R_{14}$ | 3300 ohms |
| $R_{15}$ | 22K ohms |
| $R_{16}$ | 22K ohms |
| $R_{17}$ | 27K ohms |
| $R_{18}$ | 27K ohms |
| $R_{19}$ | 3300 ohms |
| $R_{20}$ | 3300 ohms |
| $R_{21}$ | 3300 ohms |
| $R_{22}$ | 3300 ohms |
| $R_{23}$ | 820 ohms |
| $R_{24}$ | 820 ohms |
| $R_{25}$ | 820 ohms |
| $R_{26}$ | 820 ohms |
| $C_1$ | .1 $\mu f$ (PREC.) |
| $C_2$ | .1 $\mu f$ (PREC.) |
| $C_3$ | 1 $\mu f$ (PREC.) |
| $C_4$ | 1 $\mu f$ (PREC.) |
| $C_5$ | 10 $\mu f$ (PREC.) |
| $C_6$ | 10 $\mu f$ (PREC.) |
| $C_7$ | 100 $\mu f$ (PREC.) |
| $C_8$ | 100 $\mu f$ (PREC.) |
| $C_9$ | .01 $\mu f$ |
| $C_{10}$ | .01 $\mu f$ |
| $C_{11}$ | .01 $\mu f$ |
| $C_{12}$ | .01 $\mu f$ |
| $C_{13}$ | .01 $\mu f$ |
| $C_{14}$ | .01 $\mu f$ |
| $C_{15}$ | .01 $\mu f$ |
| $C_{16}$ | .01 $\mu f$ |
| $C_{17}$ | .01 $\mu f$ |
| $C_{18}$ | .01 $\mu f$ |
| $C_{19}$ | .01 $\mu f$ |
| $C_{20}$ | .01 $\mu f$ |
| $C_{21}$ | 1000 $\mu f$ |
| $C_{22}$ | 1000 $\mu f$ |
| $C_{23}$ | .047 $\mu f$ |
| $C_{24}$ | .047 $\mu f$ |

-continued

| | |
|---|---|
| $C_{25}$ | .01 μf |
| $C_{26}$ | .01 μf |
| $D_1$ | IN 4149 |
| $D_2$ | IN 4149 |
| $D_3$ | LED |
| $D_4$ | LED |
| $Z_1$ | Teledyne 643-1 |
| $Z_2$ | Teledyne 643-1 |
| $Z_3$ | Teledyne 643-1 |
| $Z_4$ | Teledyne 643-1 |
| $Q_1$ | 2N1711 |
| $Q_2$ | 2N1711 |
| $Q_3$ | 2N1711 |
| $Q_4$ | 2N1711 |
| $U_1$ | NE555 |
| $U_2$ | NE555 |
| $U_3$ | F9946 |
| $U_4$ | M7490 |
| $U_5$ | F9946 |
| $U_6$ | F9936 |
| $U_7$ | NE556 |
| $U_8$ | NE555 |
| $U_9$ | NE555 |
| $U_{10}$ | F9946 |
| $U_{11}$ | F9946 |

The invention has been described with reference to the preferred embodiment. Obviously, modifications and alterations will occur to others upon the reading and understanding of the specification. It is our intention to include all such modifications and alterations insofar as they come within the scope of the appended claims with equivalents thereof.

We claim:

1. An electrical circuit for generating electrical pulses, said circuit comprising in combination:
   a timing and control circuit including means for generating a plurality of wave pulses, said wave pulses including at least a first wave pulse having a first frequency and a second wave pulse having a second frequency, said first frequency being different from said second frequency, means for distinguishing and combining said wave pulses to generate a wave signal, including high side and low side durations in proportion to said first frequency and said second frequency, respectively, means for generating delays at alternations of said wave signal, and means for converting said wave signal to electrical pulses in parallel circuit path with said wave signal;
   a power switching circuit including a plurality of high power switches; first means for coupling said high power switches with energization means and a second means for coupling a load to said high power switches; and,
   a plurality of isolating means for interfacing said timing and control circuit with said power switching circuit, whereby the output signal of said timing and control circuit determines the application of energy to said load from said energization means.

2. The electrical circuit claimed in claim 1 wherein said timing and control circuit includes means for interrupting said wave signal.

3. The electrical circuit claimed in claim 2 wherein said means for interrupting said wave signal includes a light emitting diode.

4. The electrical circuit claimed in claim 1 wherein said means for generating a plurality of wave pulses includes means for generating square wave pulses.

5. The electrical circuit claimed in claim 1 wherein said means for distinguishing and combining said wave pulses includes a quad-nand gate logic circuit.

6. The electrical circuit claimed in claim 1 wherein said means for distinguishing and combining said wave pulses includes an asynchronous counter.

7. The electrical circuit claimed in claim 1 wherein said isolating means includes a plurality of opticouplers.

8. The electrical circuit claimed in claim 1 wherein said high power switches comprises solid state switching devices.

9. The electrical circuit claimed in claim 8 wherein said solid state switching devices include high current silicon controlled recitifiers and high current transistors.

10. An electrical circuit for generating high current pulses in a wide frequency range comprising in combination:
    a timing and control circuit including at least two variable frequency square wave generators for generating step wave outputs of variable frequency, a steering circuit in series path with said square wave generators and a pulse detector and counter, circuit means for coupling the output of said pulse detector and counter with said square wave generators whereby said pulse detector output is fed back to said square wave generators to control said step wave outputs of said square wave generators and whereby said output of said pulse detector and counter comprises a single step wave signal derived from said step wave outputs of said square wave generators, first means in parallel path for respectively delaying the high side and low side of said output of said pulse detector and counter, second means in parallel path with each of the outputs of said first means for generating a signal pulse of relatively shorter time duration in associated response to said outputs of said first means;
    a power switching circuit including two sets of high power switches, each set comprised of one silicon controlled rectifier and one high current transistor, first means for coupling each of said sets with energization means and second means for coupling a load between said silicon controlled rectifier and said associated high current transistor in each of said sets; and,
    a plurality of isolating opticouplers for interfacing said timing and control circuit with said power switching circuit, whereby the timing and control circuit output signal determines the application of energy to said load from said energization means.

11. The electrical circuit claimed in claim 10 wherein said timing and control circuit includes means for interruption of said single step wave signal.

* * * * *